(12) United States Patent
Nishikubo et al.

(10) Patent No.: US 9,465,537 B2
(45) Date of Patent: Oct. 11, 2016

(54) MEMORY SYSTEM AND METHOD OF CONTROLLING MEMORY SYSTEM

(71) Applicant: Kabushiki Kaisha Toshiba, Minato-ku (JP)

(72) Inventors: Ryuji Nishikubo, Kawasaki (JP); Hiroki Matsudaira, Funabashi (JP); Norio Aoyama, Machida (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 141 days.

(21) Appl. No.: 14/464,910

(22) Filed: Aug. 21, 2014

(65) Prior Publication Data

US 2015/0331625 A1 Nov. 19, 2015

Related U.S. Application Data

(60) Provisional application No. 61/994,585, filed on May 16, 2014.

(51) Int. Cl.
*G06F 12/00* (2006.01)
*G06F 3/06* (2006.01)

(52) U.S. Cl.
CPC ............... *G06F 3/06* (2013.01); *G06F 3/0619* (2013.01); *G06F 3/0655* (2013.01); *G06F 3/0679* (2013.01); *G06F 2206/1014* (2013.01)

(58) Field of Classification Search
CPC ............... G06F 12/00; G06F 12/0238; G06F 12/0246; G06F 3/0679
USPC ........................................ 711/100, 103, 154
See application file for complete search history.

(56) References Cited

U.S. PATENT DOCUMENTS

| | | | |
|---|---|---|---|
| 6,353,242 B1 * | 3/2002 | Watanabe ......... | G11C 16/0483 257/208 |
| 8,245,101 B2 | 8/2012 | Olbrich et al. | |
| 8,248,857 B2 | 8/2012 | Tanaka et al. | |
| 8,341,497 B2 | 12/2012 | Fukutomi et al. | |
| 8,549,366 B2 | 10/2013 | Higeta et al. | |
| 2008/0062785 A1 * | 3/2008 | Li ..................... | G11C 29/34 365/201 |
| 2013/0173972 A1 * | 7/2013 | Kubo ................ | G11C 16/00 714/718 |
| 2014/0281686 A1 * | 9/2014 | Ware ................. | G06F 11/1008 714/6.12 |
| 2015/0220394 A1 * | 8/2015 | Tanaka .............. | G06F 11/1048 714/764 |

FOREIGN PATENT DOCUMENTS

| | | |
|---|---|---|
| JP | 2000-163322 | 6/2000 |
| JP | 2010-244605 | 10/2010 |

* cited by examiner

*Primary Examiner* — Tuan Thai
(74) *Attorney, Agent, or Firm* — Oblon, McClelland, Maier & Neustadt, L.L.P.

(57) ABSTRACT

According to one embodiment, a memory system includes a nonvolatile memory including a plurality of blocks, and a controller controlling the nonvolatile memory. The controller cyclically executes patrol read, the patrol read including reading data and testing the read data, the read data being data of pages connected to some of word lines in each of the blocks of the nonvolatile memory.

14 Claims, 3 Drawing Sheets

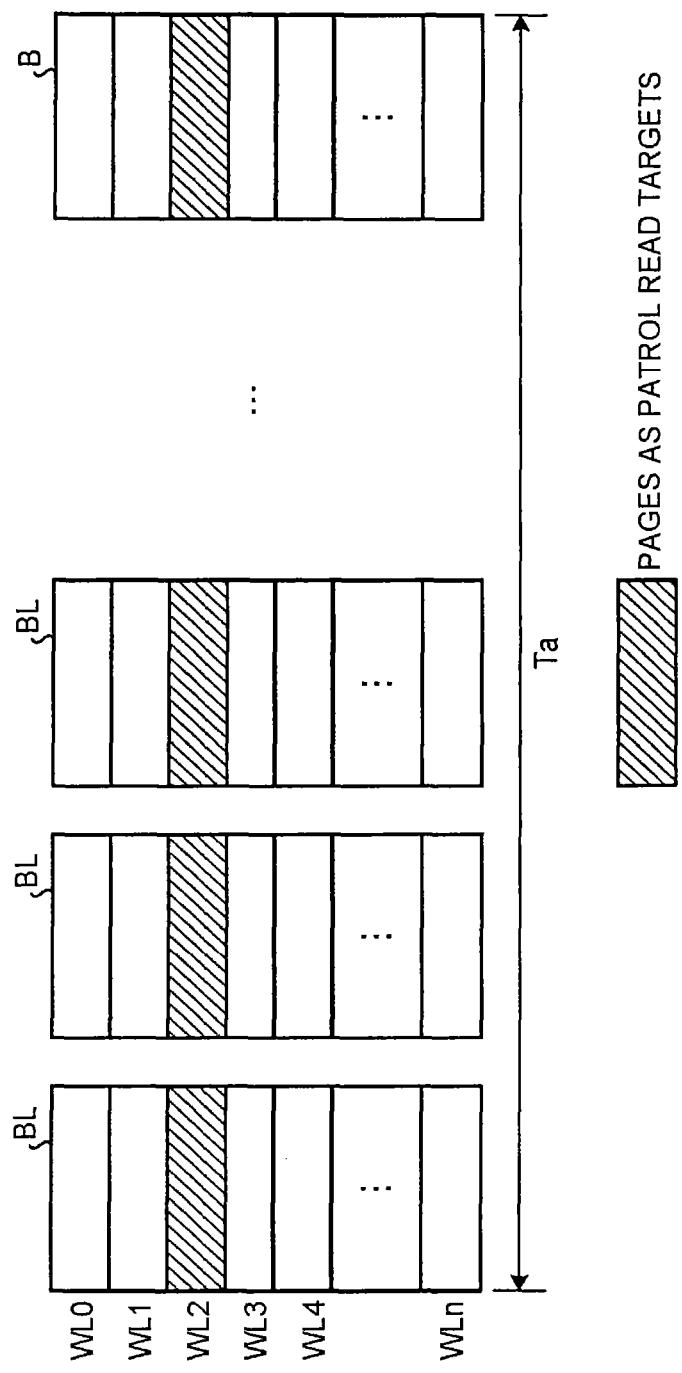

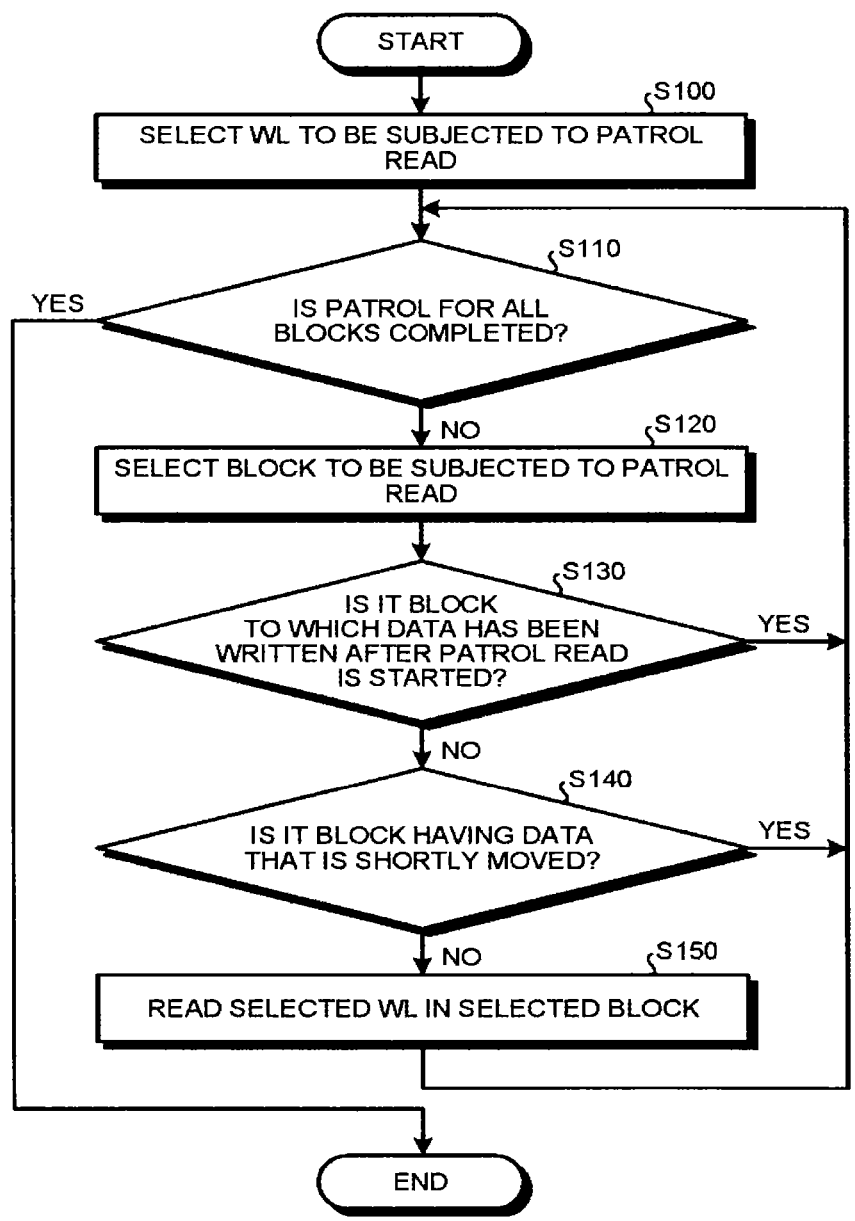

MEMORY SYSTEM AND METHOD OF CONTROLLING MEMORY SYSTEM

CROSS-REFERENCE TO RELATED APPLICATIONS

This application is based upon and claims the benefit of priority from U.S. Provisional Patent Application No. 61/994,585, filed on May 16, 2014; the entire contents of which are incorporated herein by reference.

FIELD

Embodiments described herein relate generally to a memory system including a nonvolatile memory and a method of controlling the memory system.

BACKGROUND

In a storage system including a nonvolatile memory such as a flash memory, maintenance processing called patrol read is performed to detect a block including increased errors. The patrol read includes reading and testing stored in the nonvolatile memory in predetermined units. In the patrol read, data is read from the entire area of the nonvolatile memory and is tested the read data within a predetermined cycle time.

However, the patrol read adversely increases power consumption of the memory system.

BRIEF DESCRIPTION OF THE DRAWINGS

FIG. 2 is a schematic diagram illustrating patrol read according to a first embodiment; and FIG. 3 is a flowchart illustrating an example of an operation procedure of the patrol read according to the first embodiment.

DETAILED DESCRIPTION

Figure 1:
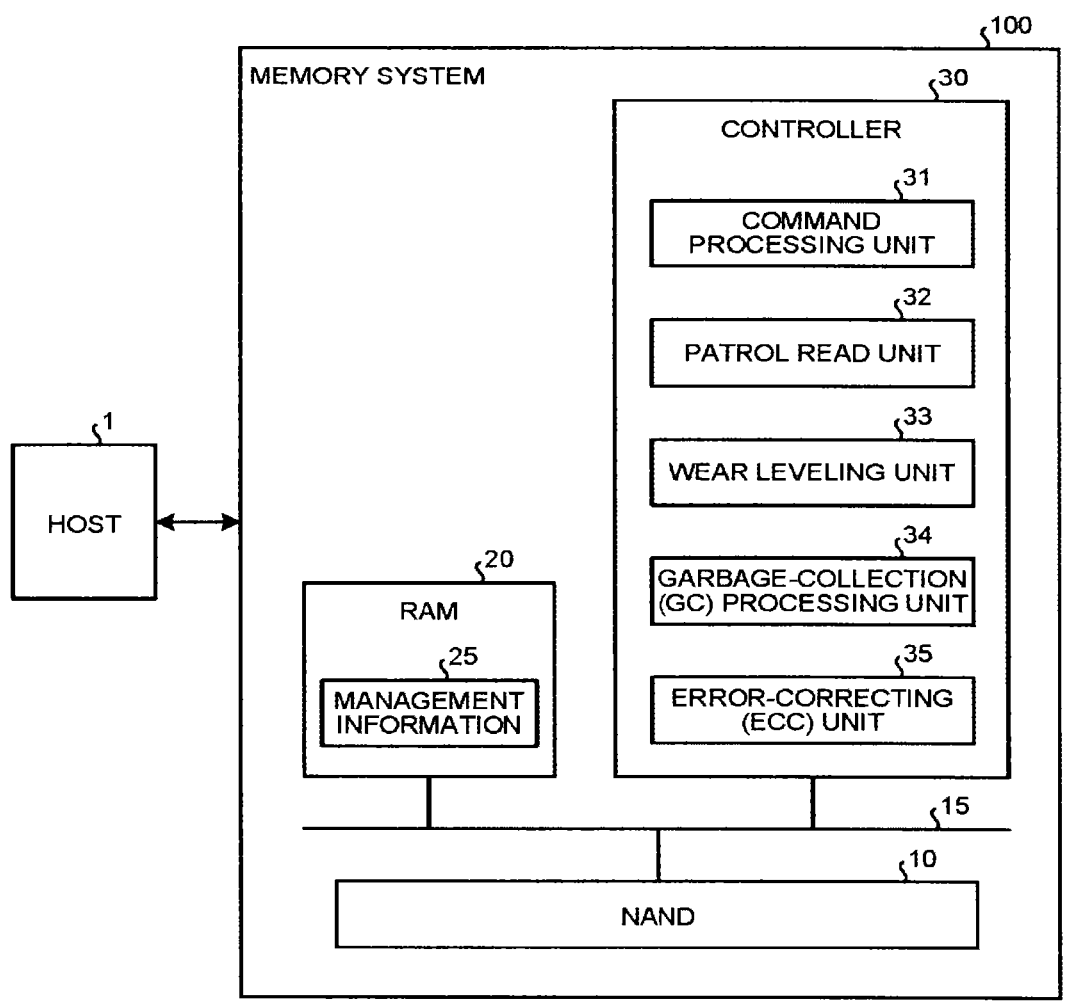
FIG. 1 is a functional block diagram illustrating an internal configuration of a memory system.

In general, according to one embodiment, a memory system includes a nonvolatile memory and a controller. The nonvolatile memory includes a plurality of blocks. Each of the blocks includes a plurality of word lines. Each of the word lines includes a plurality of memory cells. The plurality of memory cells have a storage capacity for one or more pages. The controller controls the nonvolatile memory. The controller is configured to cyclically execute patrol read. the patrol read includes reading data and testing the read data, the read data being data of pages connected to some of word lines in each of the blocks.

Exemplary embodiments of a memory system and a method of controlling the memory system will be explained below in detail with reference to the accompanying drawings. The present invention is not limited to the following embodiments.

First Embodiment

FIG. 1 is a block diagram illustrating a configuration example of an SSD (Solid State Drive) 100 being a memory system according to a first embodiment. The memory system 100 is connected to a host device (hereinafter, "host") 1 and functions as an external storage device of the host 1. The host 1 is, for example, a personal computer, a mobile phone, or an imaging device.

The memory system 100 includes a NAND flash memory (hereinafter, "NAND") 10 being a nonvolatile memory, a RAN 20 being a volatile semiconductor memory that enables faster access than the NAND 10, a controller 30, and a bus 15.

The NAND 10 stores therein user data specified by the host 1. The NAND 10 stores therein management information 25 managed by the RAN 20 for backup. The NAND 10 includes one memory chip or a plurality of memory chips. Each of the memory chips has a memory cell array having a plurality of memory cells arranged in a matrix. When each of the memory cells is an MLC (Multiple Level Cell) storage cell, two bits of information can be stored in one memory cell. When each of the memory cells is a TLC (Triple Level Cell) storage cell, three bits of information can be a stored in one memory cell.

Each of the memory chips includes a plurality of physical blocks, each of the blocks is a unit of data erasing, arranged therein. One physical block includes a plurality of memory cells connected to a plurality of word lines WL0 to WLn, respectively. A plurality of physical pages is connected to one word line in one block. In the case of the MLC, two pages including a lower page and an upper page are connected to one word line in one block. In the case of the TLC, three pages including a lower page, a middle page, and an upper page are connected to one word line in one block. In the case of the SLC, one page is connected to one word line in one block. In the NAND 10, data write and data read are performed with respect to each of the physical pages. In the NAND 10, each of the word lines includes a plurality of memory cells. The plurality of memory cells have a storage capacity for one or more pages.

The nonvolatile memory 10 is not limited to nonvolatile semiconductor memories such as the NAND flash, and nonvolatile memories capable of data storage such as flash memories other than the NAND type and three-dimensional flash memories can be adopted.

The RAM 20 has a storage area in which the management information 25 for managing the memory system 100 is stored and updated. The management information 25 includes a mapping table indicating a relation between logical addresses specified by the host 1 and storage positions (physical addresses) on the NAND 10, and the like. As the RAM 20, a volatile SRAM (Static Random Access Memory), a DRAM (Dynamic Random Access Memory), or the like is adopted. The management information 25 managed in the RAM 20 is loaded from the NAND 10 at the time of startup or the like.

A storage area serving as a write buffer that is used to temporarily store therein data when data from the host 1 is to be written to the NAND 10 and a storage area serving as a read buffer that is used to read data, to which a read request is issued from the host 1, from the NAND 10 and temporarily store therein the read data can be provided in the RAM 20.

In the memory system 100, logical blocks being virtual blocks are defined as units for collectively managing plural physical blocks. For example, each of the logical blocks includes physical blocks combined in such a manner that at least one piece of parallel processing such as channel parallel, bank interleave, and a plane double-speed operation can be performed. The logical blocks are divided into active blocks that include valid data and are being used and free blocks that include no valid data and are not being used. The management information 25 includes an active block list that manages the active blocks among the logical blocks and a free block list that manages the free blocks.

The controller 30 has a command processing unit 31, a patrol read unit 32, a wear leveling unit 33, a garbage-collection (GC) processing unit 34, and an error-correcting unit (ECC unit) 35.

The command processing unit 31 performs command processing corresponding to various commands received from the host 1. The command processing includes processing of reading data from the NAND 10, processing of writing data to the NAND 10, and the like. The command processing unit 31 updates the management information 25 managed by the RAM 20 as necessary.

The wear leveling unit 33 exchanges data of blocks having fewer rewriting times, to which rewriting has not been performed for more than a predetermined period, with blocks having more rewriting times. That is, data of an active block having fewer rewriting times is read and the read data is written to a free block having more rewriting times. The active block having fewer rewriting times is then released as a free block. The wear leveling unit 33 updates the management information 25 managed by the RAM 20 after performing the wear leveling processing.

The garbage-collection processing unit 34 (hereinafter, "GC processing unit") performs garbage collection and compaction as organization of the NAND 10. If the data erasure unit (the block) and a data read/write unit are different in the memory system 100, due to repeated rewriting of the NAND 10, the valid data in the blocks becomes more fragmented. When the blocks in such a fragmented state increases, substantially, usable blocks decrease and a storage area of the NAND 10 cannot be effectively used. Accordingly, for example, when the number of free blocks in the NAND 10 becomes smaller than a predetermined threshold, GC is performed to move valid data in GC source blocks to GC destination blocks to increase free blocks. The GC processing unit 34 updates the management information 25 managed by the RAM 20 after performing the garbage collection.

The ECC unit 35 performs encoding processing for write data using an error-correcting code and adds an encoding result to the write data to output resultant data to the NAND 10. The ECC unit 35 also performs decoding processing for data read from the NAND 10 using the error-correcting code and performs error correction of the read data.

The ECC unit 35 has a plurality of ECC units having different error-correcting capabilities. For example, the ECC unit 35 has a first-level ECC unit, a second-level ECC unit, and a third-level ECC unit having different error-correcting capabilities, respectively. The second-level ECC unit is higher than the first-level ECC unit in the error-correcting capability and the third-level ECC unit is higher than the second-level ECC unit in the error-correcting capability. Therefore, when the first-level ECC unit cannot correct errors, the second-level ECC unit performs error correction and, when the second-level ECC unit cannot correct the errors, the third-level ECC unit performs error correction.

To detect blocks having increased errors, the patrol read unit 32 executes patrol read of reading data stored in the NAND 10 in predetermined units and testing whether the read data is normal or abnormal. The patrol read is an operation to confirm whether data already recorded in the NAND 10 is not lost due to deterioration of the medium and is executed voluntarily by the memory system 100 with no instruction from the host 1.

The patrol read unit 32 executes the patrol read for the active blocks in which the valid data in the NAND 10 is recorded. The patrol read for all the active blocks is executed within a cycle time Ta. The cycle time Ta is counted in terms of time in which the memory system 100 is ON and is set at an arbitrary time unit such as 10 hours or 100 hours. That is, the patrol read is executed cyclically with the cycle time Ta being counted. When a command such as read or write is received from the host 1 in the course of the patrol read, processing of the command from the host 1 to be performed in the command processing unit 31 is prioritized.

The patrol read unit 32 reads data in small predetermined units and causes the ECC unit 35 to perform data check of the read data. While the predetermined unit is one page in the present embodiment, another unit can be used as a unit of the patrol read. When the number of errors detected by the ECC unit 35 exceeds a predetermined threshold in the patrol read in the page units, the patrol read unit 32 regards data in a block including the relevant page as a refresh target and performs refresh thereof later. For example, when error correction in the first-level ECC unit becomes impossible, the patrol read unit 32 does not perform further correction and regards data in a block including the page as the refresh target. In the refresh, data stored in a block including a page having errors more than the threshold is stored again in another block. The data stored in the original block is invalidated.

FIG. 2 schematically illustrates the patrol read in the present embodiment executed by the patrol read unit 32. In FIG. 2, a plurality of physical blocks BL included in all active blocks as targets of the patrol read in the NAND 10 is shown. In the present embodiment, the patrol read unit 32 executes the patrol read only for pages connected to one word line in each of the physical blocks BL in one cycle time Ta. Therefore, as compared to a case where the patrol read is executed on all pages connected to all word lines in each block, the number of times of read and the amount of read data are reduced and thus power consumption can be reduced.

In FIG. 2, only pages connected to a word line 2 (WL2) in the physical blocks BL included in all the active blocks are targets of the patrol read. When a timer for the cycle time Ta is reset to start the patrol read, the patrol read unit 32 selects a WL number to be subjected to the patrol read in that cycle. In the case of the MLC, the patrol read is executed on the lower page and the upper page of the word line as the patrol read target. In the case of the TLC, the patrol read is executed on the lower page, the middle page, and the upper page of the word line as the patrol read target.

Because the NAND 10 is likely to be damaged in block units, the amount of read can be reduced without degrading accuracy of detecting data errors if one word line per block is subjected to the patrol read. If a different word line is selected each time one cycle time Ta is started, it is possible to test all the word lines by repeating the cycle time Ta. That is, it suffices to change a word line as a patrol-read execution target each time the patrol read for each block is executed.

In the present embodiment, the patrol read unit 32 obtains active blocks to be subjected to the patrol read from the active block list. In the active block list, block IDs of the active blocks are listed in a predetermined order. When obtaining active blocks from the active block list, the patrol read unit 32 excludes, from targets of the patrol read, blocks that have been written recently because there is a high possibility that errors are not increased in the blocks that have been written recently. Specifically, active blocks to which data has been written after start of one cycle time Ta of the patrol read are excluded from the targets of the patrol read.

For this determination processing, an ESC (Erase Sequence Count) value is used, for example. The ESC value indicates the accumulation value of the erase counts of all blocks from the initial startup of the memory system 100 to the present. Every time a block erase is performed, the controller 30 updates the management information 25 that indicates the ESC value of the active block to which block erase has been performed. Therefore, ESC value at a time when one cycle time Ta of the patrol read is started is stored and active blocks having larger ESC value than the stored ESC value are excluded from the targets of the patrol read.

The patrol read unit 32 excludes blocks having data that is to be moved by garbage collection, wear leveling, or error detection from the targets of the patrol read because it is meaningless to regard these blocks as the targets of the patrol read.

While each of the word lines in each physical block includes a plurality of pages (a lower page, a middle page, and an upper page), reliabilities of these pages are often unequal. Accordingly, at the time of the patrol read, it is possible to regard only pages with the lowest reliability among the pages as the patrol read targets.

FIG. 3 is a flowchart illustrating an operation procedure of the patrol read in the first embodiment. When the cycle time Ta of the patrol read is started, the controller 30 selects one WL number as a patrol read target in the cycle (Step S100). The controller 30 then determines whether the patrol read for all blocks has been completed (Step S110) and, when the patrol read for all blocks has not been ended, refers to the active block list to select an active block as a patrol read target (Step S120).

The controller 30 then determines whether the selected active block is a block to which data has been written after the patrol read is started (Step S130). When the determination result is YES, the procedure proceeds to Step S110 and the controller 30 excludes the selected active block from the patrol read target.

When the determination result at Step S130 is NO, the controller 30 determines whether the selected active block is a block having data that is to be shortly moved by garbage collection or wear leveling (Step S140). When the determination result is YES, the procedure proceeds to Step S110 and the controller 30 excludes the selected active block from the patrol read target.

When the determination result at Step S140 is NO, the controller 30 reads pages of the selected word line in each of plural physical blocks included in the selected active block from the NAND 10 to test data of the read pages in the ECC unit 35. During read, data can be read from only a page with the lowest reliability among the pages on the selected word line. Identical processing is then repeated until the patrol read for all the active blocks is ended.

As described above, in the present embodiment, the patrol read is executed on pages connected to one word line of each of patrol target blocks. Therefore, the amount of read can be reduced while the original object of the patrol read to detect blocks having increased errors in data is achieved and thus the power consumption can be reduced.

When blocks to which data has been written after start of one cycle time Ta of the patrol read or blocks having data that is to be shortly moved by garbage collection or wear leveling are excluded from patrol read targets, the power consumption can be reduced more. Furthermore, when only a page with the lowest reliability among pages connected to one word line in each of patrol target blocks is regarded as a patrol read target, the power consumption can be reduced more.

While the pages connected to one word line in each of physical blocks included in the active blocks are regarded as the patrol read targets in the above embodiment, pages connected to some of word lines in each of the physical blocks can be regarded as the patrol read targets. While blocks including valid data are selected in units of logical blocks (active blocks) in the above embodiment, blocks including valid data can be selected in units of physical blocks.

While the patrol read is executed on an area in which the valid data of the NAND 10 is stored in the above embodiment, the patrol read can be executed on the entire logical address space or can be executed for the entire physical address space.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a nonvolatile memory including a plurality of blocks, each of the blocks including a plurality of word lines, each of the word lines including a plurality of memory cells, the plurality of memory cells having a storage capacity for one or more pages; and
    a controller configured to:
    cyclically execute patrol read, the patrol read including reading data and testing the read data, the read data being data of pages connected to one or more but not all of the word lines in each of the blocks;
    change a word line as an execution target of the patrol read each time a patrol read cycle is started;
    wherein the patrol read includes error correction that is performed using an error-correcting code added to the data; and
    wherein when number of errors in the read data exceeds a predetermined threshold, the controller moves data in a block including the read data to another block.

2. The memory system according to claim 1, wherein the patrol read is executed on pages connected to one of the word lines in each of the blocks.

3. The memory system according to claim 1, wherein the controller is configured to exclude, from targets of the patrol read, block to which data has been written after the patrol read is started.

4. The memory system according to claim 1, wherein the controller is configured to exclude, from targets of the patrol read, block having data that is to be moved to another block after the patrol read is started.

5. The memory system according to claim 1, wherein the controller is configured to execute the patrol read for one page with a low reliability among a plurality of pages connected to some of word lines in each of the blocks.

6. The memory system according to claim 1, wherein patrol read is executed on blocks including valid data.

7. The memory system according to claim 1, wherein the nonvolatile memory is a NAND flash memory.

8. A method of controlling a memory system including a nonvolatile memory including a plurality of blocks, each of the blocks including a plurality of word lines, each of the word lines including a plurality of memory cells, the plurality of memory cells having a storage capacity for one or more pages, the method comprising:
cyclically executing patrol read, the patrol read including reading data and testing the read data, the read data being data of pages connected to one or more but not all of word lines in each of the blocks;
changing a word line as an execution target of the patrol read each time a patrol read cycle is started;
wherein the patrol read includes error correction that is performed using an error-correcting code added to the data; and
moving data in a block including the read data to another block when number of errors in the read data exceeds a predetermined threshold.

9. The method of controlling the memory system according to claim 8, wherein the patrol read is executed on pages connected to one of the word lines in each of the blocks.

10. The method of controlling the memory system according to claim 8, further comprising excluding, from targets of the patrol read, block to which data has been written after the patrol read is started.

11. The method of controlling the memory system according to claim 8, further comprising excluding, from targets of the patrol read, block having data that is to be moved to another block after the patrol read is started.

12. The method of controlling the memory system according to claim 8, further comprising executing the patrol read for one page with a low reliability among a plurality of pages connected to some of word lines in each of the blocks.

13. The method of controlling the memory system according to claim 8, wherein the patrol read is executed on blocks including valid data.

14. The method of controlling the memory system according to claim 8, wherein the nonvolatile memory is a NAND flash memory.

* * * * *